United States Patent
Byun et al.

(10) Patent No.: US 7,747,912 B2
(45) Date of Patent: Jun. 29, 2010

(54) SEMICONDUCTOR MEMORY DEVICE CAPABLE OF ARBITRARILY SETTING THE NUMBER OF MEMORY CELLS TO BE TESTED AND RELATED TEST METHOD

(75) Inventors: Sang-man Byun, Suwon-si (KR); Sang-cheol Kim, Yongin-si (KR); Jong-hyoung Lim, Hwaseong-si (KR); Gwan-pyo Hong, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 380 days.

(21) Appl. No.: 11/774,052

(22) Filed: Jul. 6, 2007

(65) Prior Publication Data
US 2008/0022170 A1   Jan. 24, 2008

(30) Foreign Application Priority Data
Jul. 10, 2006   (KR) ............... 10-2006-0064464

(51) Int. Cl.
*G11C 29/00* (2006.01)
(52) U.S. Cl. .................................. 714/718
(58) Field of Classification Search ............ 714/718, 714/724; 365/201
See application file for complete search history.

(56) References Cited

U.S. PATENT DOCUMENTS

| 5,267,206 | A  | * | 11/1993 | Koyabu .................. 365/201 |
| 6,421,794 | B1 | * | 7/2002  | Chen et al. ............... 714/42 |
| 7,113,435 | B2 | * | 9/2006  | Santin ..................... 365/201 |
| 7,152,192 | B2 | * | 12/2006 | Brummel et al. ......... 714/718 |
| 7,254,763 | B2 | * | 8/2007  | Aadsen et al. ............ 714/733 |
| 7,355,911 | B2 | * | 4/2008  | Hartmann ................ 365/200 |
| 7,362,633 | B2 | * | 4/2008  | Fekih-Romdhane ..... 365/201 |
| 2007/0016826 | A1 | * | 1/2007 | Dubey ..................... 714/30 |

FOREIGN PATENT DOCUMENTS

| JP | 11162196 | 6/1999 |
| KR | 1020010026496 A | 4/2001 |
| KR | 1020060031393 A | 4/2006 |

* cited by examiner

*Primary Examiner*—James C Kerveros
(74) *Attorney, Agent, or Firm*—Volentine & Whitt, PLLC

(57) ABSTRACT

A semiconductor memory device and related test method are disclosed. Test data is defined from a group of M test bits selected from either input data or corresponding output data. A parallel bit test is then conducted on the test data. The M test bits include N test bits, where N is less than M, selected on a bit by bit basis from the output data, and L test bits, where N+L=M, selected from the input data. The selection of input data may be made in accordance with a don't care case for selected test data.

15 Claims, 5 Drawing Sheets

SEMICONDUCTOR MEMORY DEVICE CAPABLE OF ARBITRARILY SETTING THE NUMBER OF MEMORY CELLS TO BE TESTED AND RELATED TEST METHOD

BACKGROUND OF THE INVENTION

1. Field of the Invention

The present invention relates to semiconductor memory devices. More particularly, the invention relates to semiconductor memory devices capable of arbitrarily setting the number of memory cells to be tested during a parallel bit test (PBT) and a related test method.

This application claims the benefit of Korean Patent Application No. 10-2006-0064464, filed on Jul. 10, 2006, the subject matter of which is hereby incorporated by reference.

2. Description of the Related Art

Synchronous semiconductor memory devices include a plurality of memory cells arranged in a matrix. A defective memory cell among this plurality of memory cells can cause problems during operation of a system incorporating the constituent memory device.

As the integration density and operating speed of synchronous memory devices increases, the ability to detect and correct defective memory cells during ever more efficient test procedures become increasingly important. Accordingly, numerous types of test procedures adapted to detect and/or correct defective memory cells have been developed.

FIG. 1 illustrates an exemplary configuration for a conventional semiconductor memory device 10 capable of undergoing a parallel bit test (PBT). Referring to FIG. 1, semiconductor memory device 10 performs the PBT on four bits of cell data—D0, D1, D2 and D3. Semiconductor memory device 10 accordingly includes a circuit designed to facilitate this 4-bit test mode. In the illustrated embodiment, cell data D0, D1, D2 and D3 are assumed to have values of "1", "0", "1" and "0", respectively.

Semiconductor memory device 10 includes first, second and third comparators; FCOMP0, FCOMP1 and SCOMP0. The first comparator FCOMP0 compares the first cell data D0 to the third cell data D2, and the second comparator FCOMP1 compares the second cell data D1 to the fourth cell data D3.

The first, second and third comparators FCOMP0, FCOMP1 and SCOMP0 respectively execute an exclusive-OR operation. Accordingly, the first comparator FCOMP0 outputs "PASS" as a comparison result when the first cell data D0 and the third cell data D2 have the same value and outputs "FAIL" as a comparison result when the first cell data D0 and the third cell data D2 respectively have different values. The second comparator FCOMP1 outputs "PASS" when the second cell data D1 and the fourth cell data D3 have the same value and outputs "FAIL" when the second cell data D1 and the fourth cell data D3 respectively have different values, The third comparator SCOMP0 compares the output signal of the first comparator FCOMP0 to the output signal of the second comparator FCOMP1. The third comparator SCOMP0 outputs "PASS" when the output signals of the first and second comparators FCOMP0 and FCOMP1 are identical to each other and outputs "FAIL" when the output signals of the first and second comparators FCOMP0 and FCOMP1 are different from each other. When the third comparator SCOMP0 outputs "PASS", the result of the PBT performed on the four cell data D0, D1, D2 and D3 is determined to be acceptable (i.e., a "PASS" value is output).

In the illustrated example, it is assumed that a memory cell storing the first cell data D0 is defective. That is, the first cell data D0 is "1" when the corresponding input to semiconductor memory device 10 should have resulted in stored "0". Such a failure may be generated when stray electrical current from neighboring memory cells changes the stored data value. Accordingly, the first comparator FCOMP1 compares the first cell data D0 having a value "0" to the third cell data D2 having a value "1". As a result, the first comparator FCOMP0 outputs "FAIL".

The third comparator SCOMP0 outputs "FAIL" because the output signals of the first and second comparators FCOMP0 and FCOMP1 are different from each other irrespective of whether memory cells storing the other cell data D1, D2 and D3 are defective or not. Accordingly, the PBT result relative to all four cell data D0, D1, D2 and D3 is determined to be unacceptable (i.e. a "FAIL" value is output).

In this context, conventional semiconductor memory devices perform parallel bit testing on a fixed minimum grouping of cell data. The corresponding test circuitry is defined in relation to this cell data grouping. Once defined, the amount of cell data being tested is restricted by the particular design of test circuitry and selected data input to the test circuitry.

For example, when the four cell output data D0, D1, D2 and D3 are tested using the circuitry illustrated in semiconductor memory device of FIG. 1, the four cell data may only have acceptable values of "0000", "01011", "1010", and "1111". Individual memory cells may not be tested outside this group of acceptable data values. Thus, if one or more memory cells generates erroneous data, the memory cell paired with the defective memory cell may not be effectively tested because the PBT circuitry is too rigid in its application.

SUMMARY OF THE INVENTION

Embodiments of the invention provide a semiconductor memory device and related test method capable of performing a test on each bit of test data regardless of the presence of a defective memory cell in the group of memory cells being tested.

In one embodiment, the invention provides a semiconductor memory device comprising; a controller providing test data to a test unit, the test unit performing a test on the test data to determine whether a memory cell associated with a bit of output data is defective, wherein the controller configures the test data from a group of test bits, each test bit being either an output data bit or a corresponding input data bit selected in accordance with a corresponding mode signal, and wherein the corresponding mode signal selects the output data bit unless the memory cell associated with the test bit is designated as a don't care case.

In another embodiment, the invention provides a semiconductor memory device comprising; a memory array comprising M memory cells storing M bits of input data and outputting the M bits of stored input data as corresponding M bits of output data, a controller receiving both input data and output data, selecting M bits of test data corresponding to the M memory cells on a bit by bit basis from the input data and output data in response to corresponding mode signals, and outputting the test data; and, a test unit performing a parallel bit test (PBT) on the test data, wherein one of the M memory cells is defective and one mode signal corresponding to the defective memory cell selects an input data bit associated with the defective memory cell, and other mode signals corresponding to the memory cells other than the defective memory cell respectively select output data bits associated with the other memory cells.

In another embodiment, the invention provides a test method for a semiconductor memory device comprising a memory cell array receiving and storing input data and outputting corresponding output data, the test method comprising; defining test data from a group of M test bits selected from the input data and the output data, and conducting a parallel bit test on the test data, wherein the M test bits comprises N test bits, where N is less than M, selected on a bit by bit basis from the output data, and L test bits, where N+L=M, selected from the input data.

In a related aspect, the group of M test bits may correspond bit for bit with a group of M memory cells including L defective memory cells, and the L test bits may be selected in relation to the L defective memory cells and the N test bits may be selected in relation to N non-defective memory cells within the group of M memory cells.

BRIEF DESCRIPTION OF THE DRAWINGS

Embodiments of the present invention will be described with reference to the attached drawings in which.

DESCRIPTION OF EMBODIMENTS

Figure 1:
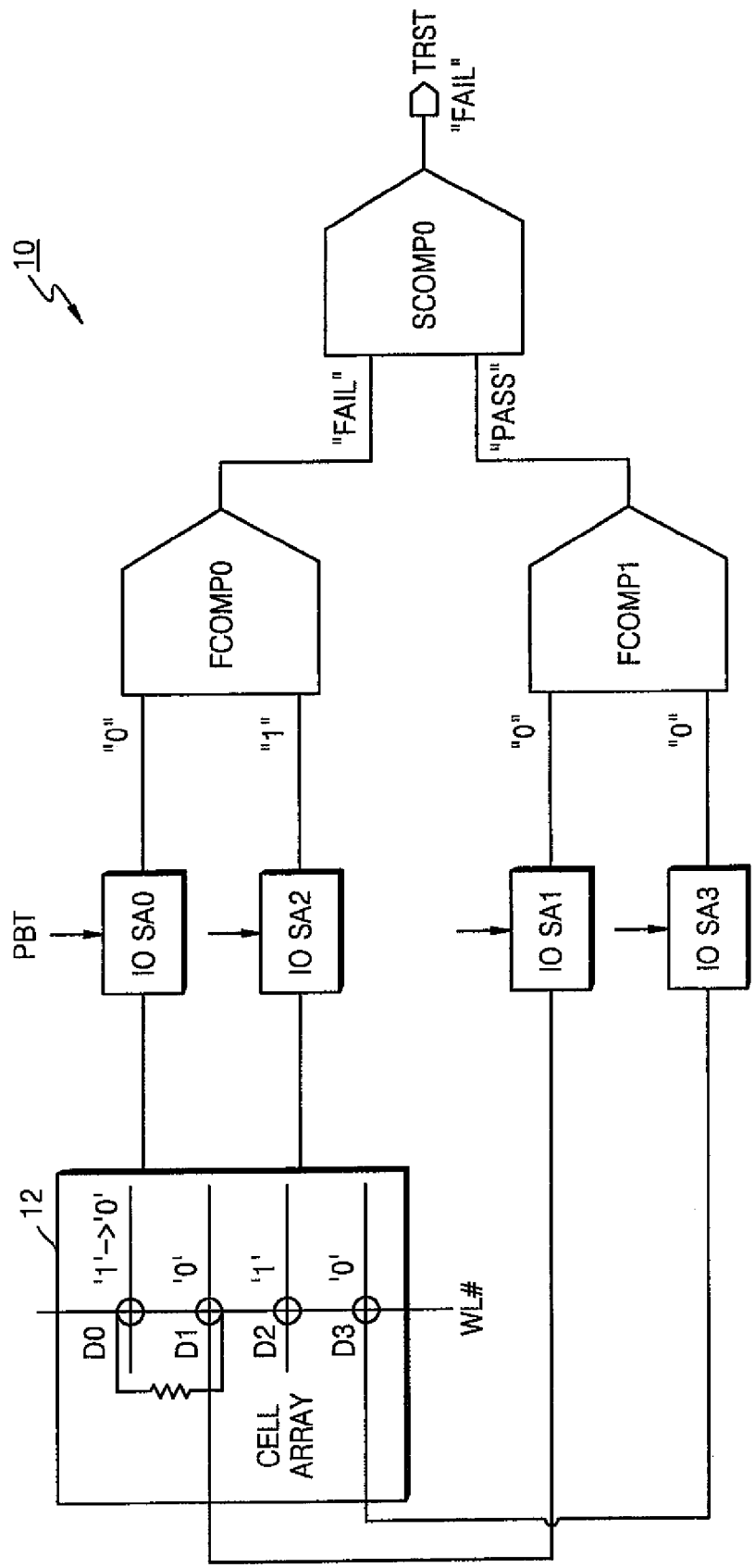
FIG. 1 illustrates a configuration of a conventional semiconductor memory device carrying out a parallel bit test (PBT)

Embodiments of the invention will now be described with reference to accompanying drawings. The invention may, however, be embodied in many different forms and should not be construed as being limited to only the embodiments set forth herein. Rather, the illustrated embodiments are presented as teaching examples. Throughout the written description and drawings, like reference numerals refer to like or similar elements.

Figure 2:
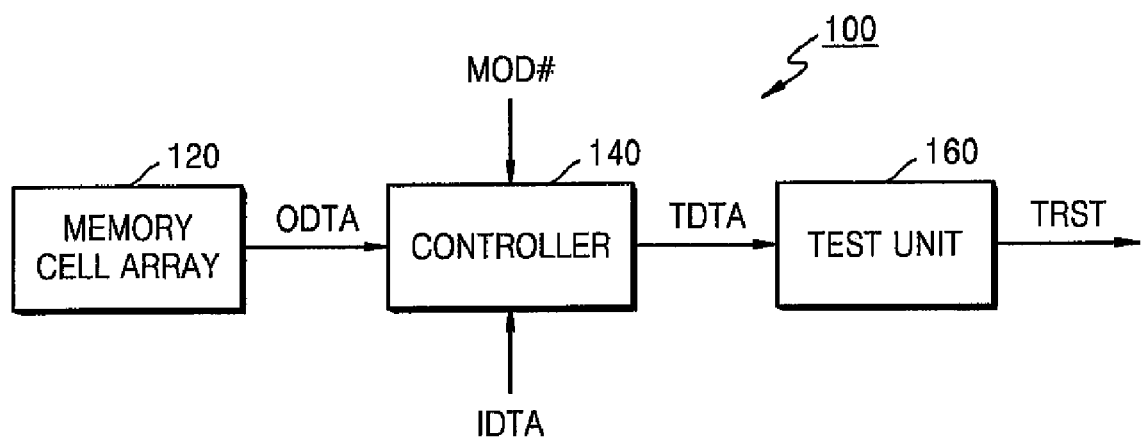
FIG. 2 is a block diagram of a semiconductor memory device carrying out a PBT according to an embodiment of the present invention.

FIG. 2 is a general block diagram illustrating aspects of a semiconductor memory device 100 capable of performing a parallel bit test (PBT) according to an embodiment of the invention. Referring to FIG. 2, semiconductor memory device 100 includes a controller 140 and a test unit 160. Controller 140 selects between output data (ODTA) and input data (IDTA) in response to a mode signal (MOD#) and outputs the selection as test data (TDTA).

Test unit 160 performs a test on the received test data TDTA in order to detect whether a memory cell associated with the output data ODTA is defective. In the illustrated embodiment, the test is assumed to be a PBT, but other types of tests may be similarly run.

In the context of the foregoing selection, the input data IDTA is data applied to memory cell array 120, and the output data ODTA is data output from cell array 120 which should, assuming proper operation of the constituent memory cells in memory cell array 120, correspond to the applied input data.

Thus, when all of the memory cells storing input data IDTA (and subsequently outputting the output data ODTA) are operating properly (i.e., are not defective), the output data ODTA will have the same value as the input data IDTA. In contrast, when one or more memory cells storing the input data IDAT is defective, the output data ODTA will be different from the input data IDTA.

Controller 140 may arbitrarily define a quantity of output data ODTA to be used as the test data TDTA. In this regard, controller 140 may select some subset of the output data ODTA as the test data TDTA in order to test the memory cells storing the output data ODTA. Controller 140 may also select a subset of the input data IDTA as the test data TDTA in order to perform a test, irrespective of whether or not a memory cell storing the input data IDTA is defective.

An exemplary PBT operation for semiconductor memory device 100 will now be explained in some additional detail with reference to FIGS. 3 and 4.

Figure 3:
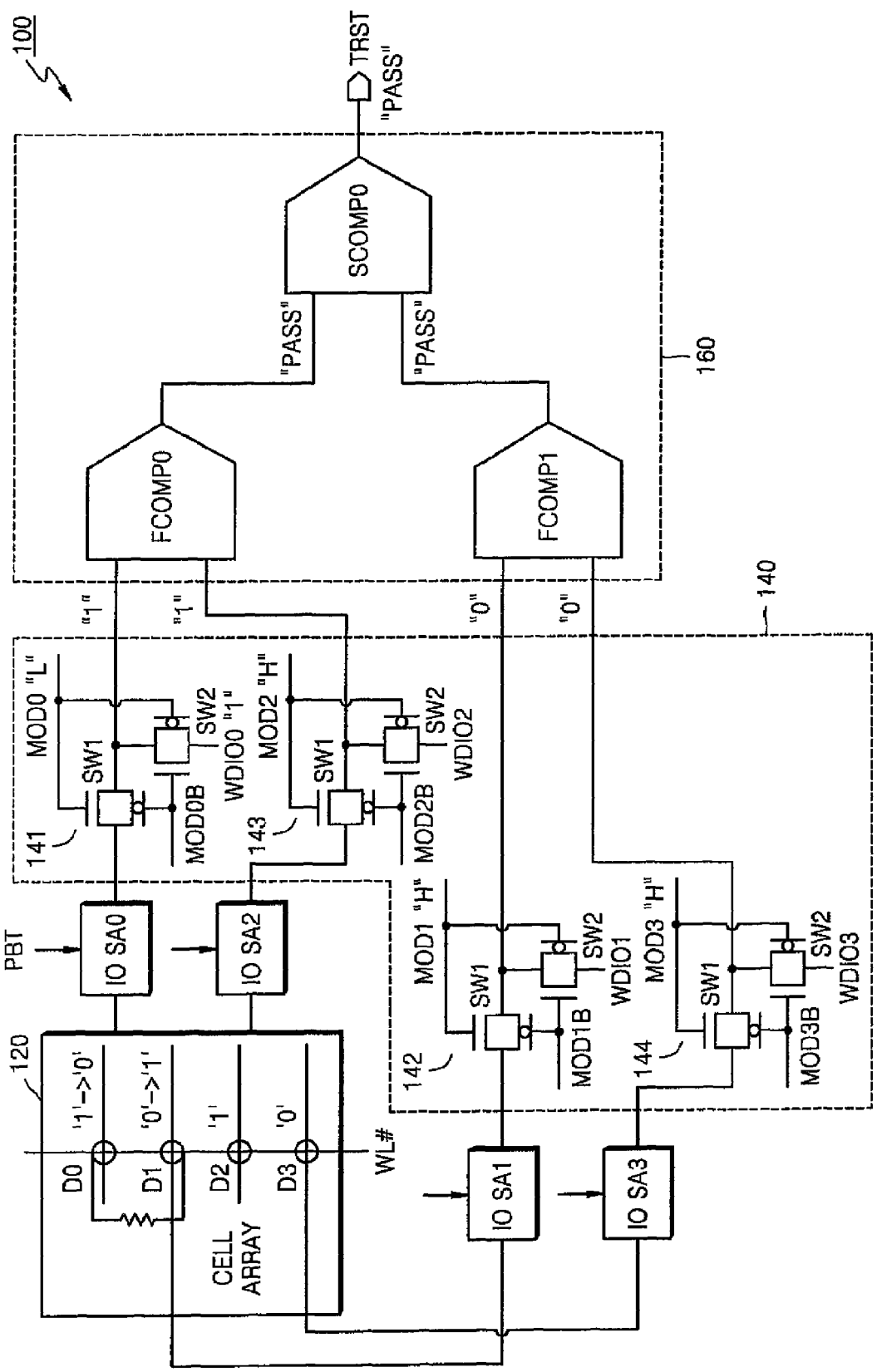
FIG. 3 illustrates a configuration of the semiconductor memory device illustrated in FIG. 2, which performs a test on a normal memory cell storing cell data D1 irrespective of whether a memory cell storing cell data D0 is defective and outputs "PASS"
Figure 4:
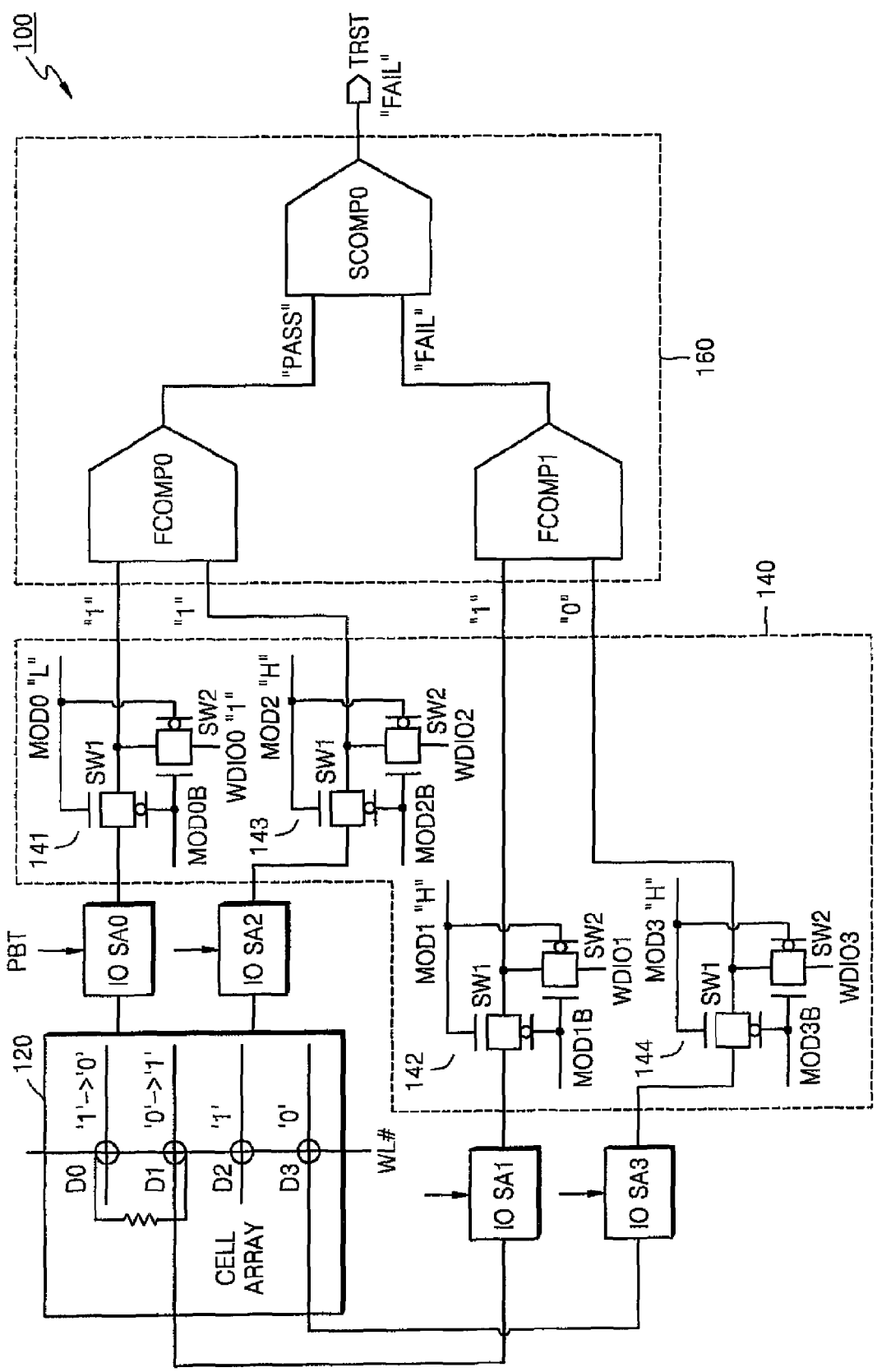
FIG. 4 illustrates a configuration of the semiconductor memory device illustrated in FIG. 2, which performs a test on a defective memory cell storing cell data D1 irrespective of whether a memory cell storing cell data D0 is defective and outputs "FAIL"

FIG. 3 illustrates one more specific configuration of semiconductor memory device 100 shown generally in FIG. 2. Semiconductor memory device 100 is capable of performing a PBT on a normally operating memory cell storing cell data D1, irrespective of whether the adjacent memory cell storing cell data D0 is defective. In other words, the illustrated embodiment of the invention may determine the normal operation of memory cell D1 and outputs a "PASS" signal indication, regardless of memory cell D0.

Referring to FIGS. 2 and 3, the first, second, third and fourth cell data D0, D1, D2 and D3 are respectively applied to first, second, third and fourth memory cells of memory cell array 120. In the working example, it is assumed that the first, second, third and fourth cell data D0, D1, D2 and D3 have respective values of "1", "0", "1" and "0".

In this example, it is further assumed that only the first memory cell is defective. Under these assumptions, the output data from the first, second, third and fourth memory cells will be "0", "0", "1" and "0". Thus, the output data and its corresponding input data have different data values indicating a defective memory cell associated with the data set.

Controller 140 comprises first, second, third and fourth selectors 141, 142, 143 and 144. Selectors 141, 142, 143 and 144 respectively select between corresponding output data ODTA and input data IDTA in response to mode signals MOD0, MOD1, MOD2 and MOD3. When the PBT is performed irrespective of whether a memory cell corresponding to output data ODTA is defective, a mode signal MOD# for the selector associated with the output data from the defective memory cell is set to a first logic (e.g., a low level in the example illustrated in FIG. 3).

In the illustrated embodiment, data is received in controller 140 from memory array 120 through corresponding test enable latches IO SA0, IO SA1, IO SA2, and IO SA3, each gated by an applied test node signal PBT.

Each of the selectors 141, 142, 143 and 144 comprises a first switch SW1 and a second switch SW2. The first switch SW1 outputs corresponding input data IDTA when the mode signal MOD#, which is set to the first logic level, is applied to the corresponding selector. The second switch SW2 outputs output data ODTA when the mode signal MOD#, which is set to a second logic level (e.g., a high level in the example illustrated in FIG. 3), is applied to the corresponding selector.

First selector 141 is used to perform the PBT on the first cell data D0. The input data IDTA of the first memory cell storing the first cell data D0 is "1" but the output data ODTA of the first memory cell is "0". Thus, the first memory cell is determined to be defective, as described above.

It is further assumed as this point that the first cell data D0 is not the memory cell being tested in the illustrated embodiment of the invention. That is, it is currently not relevant whether the first memory cell is defective or not. Accordingly, the first mode signal MOD0 is set to the first logic level during this testing period and applied to first selector 141. Since the first mode signal MOD0 applied to the first selector 141 is set to the first logic level, the first switch SW1 of first selector 141 is turned OFF and the second switch SW2 of first selector 141 is turned ON. As a result, first selector 141 selects the input data IDTA associated with the first memory cell and not the output data ODTA associated with the first memory cell.

In the embodiment illustrated in FIG. 3, the second, third and fourth selectors 142, 143 and 144 are respectively provided with the second, third and fourth mode signals MOD1, MOD2 and MOD3. Under the foregoing assumptions, however, these mode signals are set to the second logic level. Thus, the second, third and fourth selectors 142, 143 and 144 select corresponding output data ODTA.

Test unit 160 includes two (2) first comparators FCOMP0 and FCOMP1 and a second comparator SCOMP0. Each first comparator FCOMP0 and FCOMP1 compares applied test data TDTA and outputs a "PASS" signal when the applied test data TDTA have the same logic value. The "PASS" signal may be defined as either a logic low level "L" or a logic high level "H".

The second comparator SCOMP0 compares the results output by the first comparators FCOMP0 and FCOMP1 and outputs a test result signal (TRST). The second comparator SCOMP0 outputs a "PASS" signal as the test result signal TRST when the output from the first comparators FCOMP0 and FCOMP1 are logically the same.

In the illustrated embodiment, first comparator FCOMP0 compares test data TDTA output from first selector 141 to test data TDTA output from third selector 143. Similarly, first comparator FCOMP1 compares test data TDTA output from second selector 142 to test data TDTA output from fourth selector 144. Under the specific assumptions set forth above, first comparator FCOMP0 outputs "PASS" because the test data TDTA from first selector 141 and third selector 143 has a logic value of "1". First comparator FCOMP1 also outputs a "PASS" signal because the test data TDTA output from second selector 142 and fourth selector 144 has a logic value of "0". Second comparator SCOMP0 outputs a "PASS" signal as the test result signal TRST, because both first comparator FCOMP0 and FCOMP1 outputs have a similar "PASS" signal logic level.

As may be seen from the foregoing example, the defective first memory cell D0 may be handed as a "don't care" data input to the PBT circuitry. In this manner, second, third and fourth memory cells D1, D2, and D3 may be appropriately tested and a valid test outcome indicated regardless of the defective nature of first memory cell D0.

Phrased differently, "N" bits of output data from a memory cell array are nominally applied to the PBT circuit. However, when one or more of the N memory cells associated with storing the N bits of output data is determined to be defective (e.g., by a comparison of the corresponding input and output data), "M" bits of output data are actually applied to the PBT circuit along with "L" don't care bits, where M is less than N and L is equal to the number of don't care output bits. Collectively, the M bits of output data and the L don't care bits are run through the PBT circuitry to effectively test the non-defective memory cells.

Within this testing context, a threshold may be defined for a maximum number of "don't care" cases acceptable as inputs. For example, a single defective memory cell may be allowable due to related error detection and correction capabilities within the semiconductor memory device 100. A second defective memory cell may, however, exceed such capabilities and result in a failed testing result.

FIG. 4 again illustrates semiconductor memory device 100 of FIG. 3 under a different set of assumptions. Here, first memory cell D0 is defective, but second memory cell D1 is also defective. The PBT is being run to evaluate the operation of the second memory cell D1 with an understanding that the first memory cell D0 is defective. Under these assumptions, the PBT circuitry outputs a "FAIL" signal, because the second memory cell D1 is determined to be defective within memory cell array 120.

Since the test is carried out in order to detect whether the second memory cell is defective, the first mode signal MOD1 is set to the second logic level and applied to second selector 142. Accordingly, second selector 142 selects the output data ODTA associated with the second memory cell and not the corresponding input data IDTA, and communicates the selected output data ODTA to the first comparator FCOMP1.

First comparator FCOMP1 compares the output data ODTA of the second memory cell to the output data ODTA of the fourth memory cell and outputs a "FAIL" signal because the output data ODTA of the second memory cell is different from the output data ODTA of the fourth memory cell. This result may be obtained despite the fact that the first memory cell is known to be defective and the corresponding first mode signal MOD0 is applied at a first logic level (as an effective "don't care" case) to first selector 141. Thus, second comparator SCOMP0 outputs a "FAIL" signal, because the results from first comparators FCOMP0 and FCOMP1 are different.

As described above, a semiconductor memory device according to an embodiment of the invention may perform parallel bit testing on only a single memory cell. A group "M" of memory cells may also be effectively tested, even with the presence of one or more defective memory cells. Thus, overall testing flexibility is improved and timing time may be reduced in some cases. Furthermore, a semiconductor memory device according to an embodiment of the invention may arbitrarily set the value of data associated with a memory cell included in a group of M memory cells being tested. This ability allows greater flexibility in testing, as compared with conventional semiconductor memory devices, such as the one illustrated in FIG. 1.

For example, it is well recognized that parallel bit testing associated with "0" value input data in a semiconductor memory device has greater test stability than similar testing associated with "1" value input data. A semiconductor memory device according to an embodiment of the invention may carry out parallel bit testing using various data formats and thereby improve testing performance.

Figure 5:
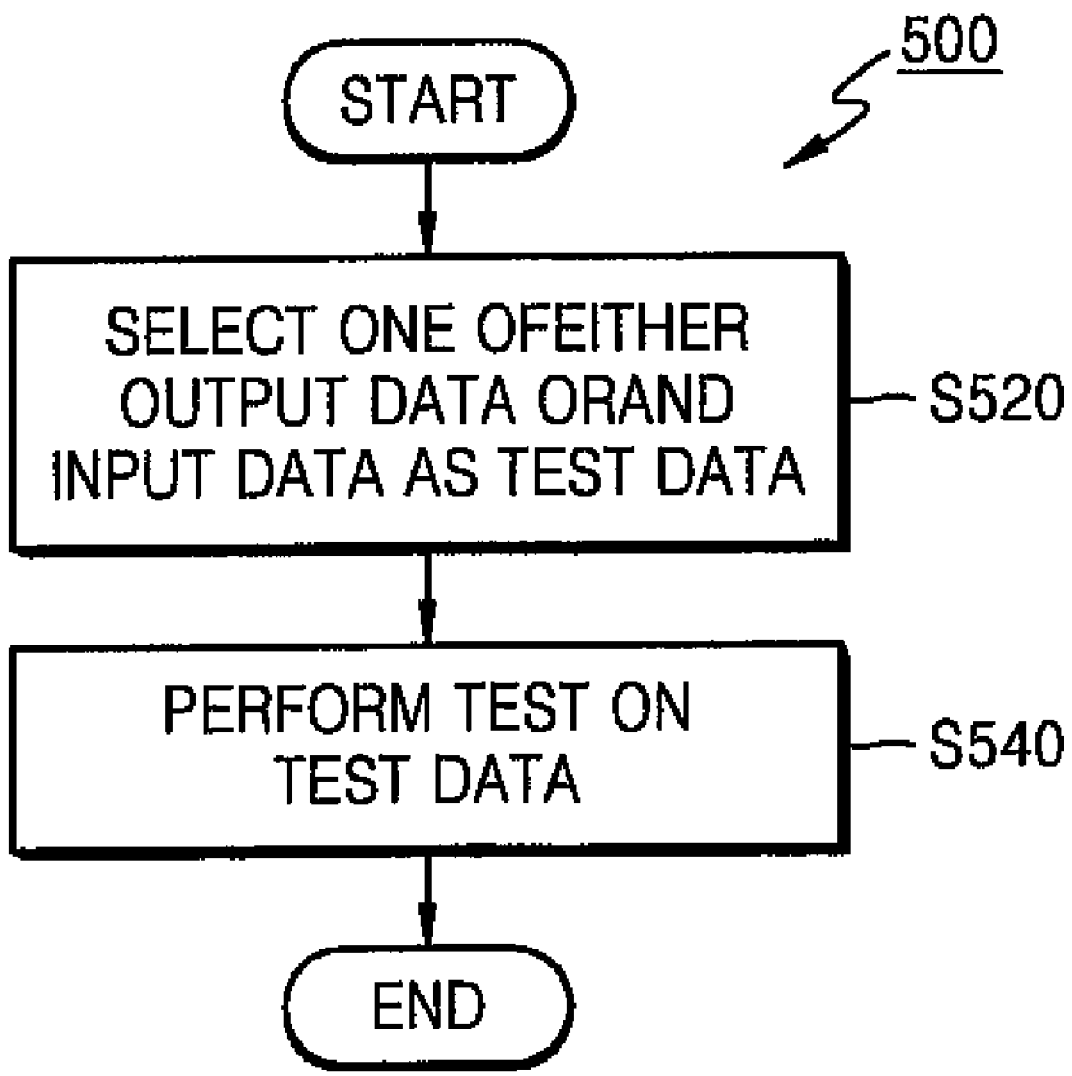
FIG. 5 is a flow chart of a test method of a semiconductor memory device according to an embodiment of the present invention.

FIG. 5 is a flow chart summarizing a test method 500 for a semiconductor memory device according to an embodiment of the present invention. Referring to FIG. 5, test method 500 includes selecting between output data or input data in response to a mode signal and outputting the selected data as test data (S520), and carrying out a test on the test data to detect whether a memory cell corresponding to the output data is defective (S540). The step of selecting between input data and corresponding output data as the test data may be carried out irrespective of whether one or more memory cells storing the output data is defective.

While the present invention has been particularly shown and described with reference to exemplary embodiments. It will be understood by those of ordinary skill in the art that various changes in form and details may be made therein without departing from the scope of the present invention as defined by the following claims. For example, while semiconductor memory device 100 has been illustrated in FIGS. 3 and 4 as performing a PBT on four data bits D0, D1, D2 and D3, it can carry out the PBT on any reasonable number of data bits. Furthermore, the assumed logic levels (e.g., for the mode signals) may all be reversed as determined by specific embodiments. Further, the illustrated examples include first comparators comparing test data bits derived from neighboring (e.g., word line sequenced) odd and even memory cells in memory array 120. However, other test bit comparisons might be configured within other embodiments of the invention.

What is claimed is:

1. A semiconductor memory device comprising:
   a test unit configured to receive test data and perform a memory test to determine whether a memory cell within a group of M memory cells providing output data is defective;
   a controller configured to receive the output data and corresponding input data previously stored in the M memory cells, and provide the test data to the test unit;
   wherein the controller is further configured to generate the test data by selecting for each one of the M memory cells either an output data bit or a corresponding input data bit selected in accordance with a corresponding mode signal,
   wherein the corresponding mode signal selects the corresponding input data bit for a memory cell in the group of M memory cells when the memory cell is designated as a don't care case during the memory test.

2. The semiconductor memory device of claim 1, wherein the controller comprises a plurality of selectors, each one selecting between an output data bit and a corresponding input data bit for each one of the M memory cells in response to a corresponding mode signal.

3. The semiconductor memory device of claim 2, wherein the corresponding mode signal has a defined first logic level selecting the input data bit when the memory cell is designated as a don't care case during the memory test and a defined second logic level selecting the output data bit otherwise.

4. The semiconductor memory device of claim 3, wherein each one of the plurality of selectors comprises:
   a first switch configured to select the corresponding input data bit when the corresponding mode signal is set to the first logic level; and
   a second switch configured to select the output data bit when the corresponding mode signal is set to the second logic level.

5. The semiconductor memory device of claim 1, wherein the memory test is a parallel bit test.

6. The semiconductor memory device of claim 1, wherein the test unit comprises:
   a plurality of first comparators, each configured to compare at least two test bits of the test data provided by the controller; and
   a second comparator configured to compare results output from at least two of the plurality of first comparators and provide a comparison result as a test result.

7. The semiconductor memory device of claim 1, wherein the controller is further configured to select the output data bit as the test data for each one of the M memory cells, unless a memory cell within the group of M memory cells is designated as a don't care case during the memory test.

8. A semiconductor memory device comprising:
   a memory array comprising M memory cells, wherein each one of the M memory cells stores an input data bit from input data received by the memory cell array and provides the stored input data bit as a corresponding output data bit among output data provided by the memory cell array;
   a controller configured to receive both the input data and the output data, and generate M bits of test data, by selecting for each one of the M memory cells its output data bit or its corresponding input data bit in response to one of a group of M mode signals; and
   a test unit configured to perform a parallel bit test (PBT) on the M bits of test data,
   wherein each one of the group of M mode signals respectively corresponds to one of the M memory cells and causes a selection by the controller of the input data bit as a corresponding bit of test data for the corresponding memory cell when the memory cell is designated as a don't care case during the PBT.

9. The semiconductor memory of claim 8, wherein the controller comprises M selectors, each receiving one of the group of M mode signals.

10. The semiconductor memory of claim 9, wherein the test unit comprises a plurality of first comparators, each receiving and comparing outputs from at least two of the M selectors; and
    at least one second comparator receiving and comparing results from at least two of the plurality of first comparators.

11. A test method for a semiconductor memory device comprising a memory cell array receiving and storing input data and outputting the stored input data as corresponding output data, the test method comprising:
    for a group of M memory cells arranged within the memory cell array, defining test data comprising M test bits, wherein each one of the M test bits corresponds to one of the M memory cells and is generated on a memory cell by memory cell basis by selecting between an input data bit stored in the memory cell or an output data bit provided by the memory cell;
    designating L memory cells of the M memory cells as don't care cases during a parallel bit test, and not designating N memory cells of the M memory cells as don't care cases during the parallel bit test, where M=N+L; and thereafter
    conducting the parallel bit test on the test data,
    wherein the M test bits comprise N test bits and L test bits respectively defined for the N memory cells and the L memory cells, such that each one of the N test bits is an output data bit and each one of the L test bits is an input data bit.

12. The test method of claim 11, wherein conducting the parallel bit test on the data comprises comparing paired test data bits in a plurality of first comparators, and thereafter comparing outputs from the plurality of first comparators to generate a test result.

13. The test method of claim 12, wherein designating the L memory cells and the N memory cells comprises defining a plurality of mode signals selecting between an output data bit or a corresponding input data bit for each one of the M memory cells.

14. The test method of claim 13, wherein each one of the plurality of mode signals is defined in relation to an assumed operating condition for a corresponding one of the M memory cells.

15. The test mode of claim 14, wherein a defective operating condition is assumed for each one of the L memory cells.

* * * * *